US011169270B2

(12) United States Patent
Ishii et al.

(10) Patent No.: US 11,169,270 B2
(45) Date of Patent: Nov. 9, 2021

(54) SOLID-STATE IMAGING DEVICE

(71) Applicant: PANASONIC INTELLECTUAL PROPERTY MANAGEMENT CO., LTD., Osaka (JP)

(72) Inventors: Motonori Ishii, Osaka (JP); Shinzo Koyama, Osaka (JP); Masato Takemoto, Osaka (JP); Shigeru Saitou, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 249 days.

(21) Appl. No.: 16/496,367

(22) PCT Filed: Mar. 19, 2018

(86) PCT No.: PCT/JP2018/010690
§ 371 (c)(1),
(2) Date: Sep. 20, 2019

(87) PCT Pub. No.: WO2018/180660
PCT Pub. Date: Oct. 4, 2018

(65) Prior Publication Data
US 2020/0412991 A1    Dec. 31, 2020

(30) Foreign Application Priority Data
Mar. 29, 2017    (JP) .............................. JP2017-064142

(51) Int. Cl.
H04N 5/378    (2011.01)
H04N 5/3745   (2011.01)
(Continued)

(52) U.S. Cl.
CPC ...... *G01S 17/894* (2020.01); *H01L 27/14612* (2013.01); *H04N 5/378* (2013.01); *H04N 5/37452* (2013.01)

(58) Field of Classification Search
CPC .... G01S 17/894; G01S 7/4873; G01S 7/4863; G01S 17/10; H01L 27/14612;
(Continued)

(56) References Cited

U.S. PATENT DOCUMENTS 10,838,066 B2 * 11/2020 Ishii ................... H04N 5/37457
2006/0192938 A1    8/2006 Kawahito
(Continued)

FOREIGN PATENT DOCUMENTS

JP    2004-294420 A    10/2004
JP    2010-032425 A    2/2010

OTHER PUBLICATIONS

Niclass, C., et al. "A 100-m Range 10-Frame/s 340x96-Pixel Time-of-Flight Depth Sensor in 0.18-μm CMOS," IEEE Journal of Solid-State Circuits; Feb. 2013; vol. 48, No. 2 (Year: 2013).*
(Continued)

*Primary Examiner* — Abdelaaziz Tissire
(74) *Attorney, Agent, or Firm* — McDermott Will and Emery LLP

(57) ABSTRACT

A solid-state imaging device including a plurality of two-dimensionally arranged pixels is provided. The pixels each include a light receiving circuit that senses incident light having arrived at the light receiving element in a light exposure period, a counter circuit that counts the number of arrivals of the incident light based on the light reception signal from the light receiving circuit, a comparison circuit that outputs a comparison signal according to the count from the counter circuit, and a storage circuit that stores a time signal as a distance signal when the comparison signal from
(Continued)

the comparison circuit is ON. Transistors included in the light receiving circuit, the counter circuit, the comparison circuit, and the storage circuit have the same conductivity type.

6 Claims, 10 Drawing Sheets

(51) Int. Cl.
*G01S 17/894* (2020.01)
*H01L 27/146* (2006.01)

(58) Field of Classification Search
CPC ........ H01L 27/14643; H01L 27/14641; H04N 5/37452; H04N 5/378; H04N 5/3745; G01C 3/06
See application file for complete search history.

(56) References Cited

U.S. PATENT DOCUMENTS

| | | |
|---|---|---|
| 2011/0157354 A1 | 6/2011 | Kawahito |
| 2012/0056078 A1 | 3/2012 | Eldesouki et al. |
| 2012/0057059 A1* | 3/2012 | Eldesouki ............ H04N 5/3535 348/302 |
| 2020/0408910 A1* | 12/2020 | Koyama ............... G01S 7/4865 |

OTHER PUBLICATIONS

International Search Report and Written Opinion dated Jun. 12, 2018 in International Application No. PCT/JP2018/010690; with partial English translation.
Niclass, C., et al. "A 100-m Range 10-Frame/s 340x96-Pixel Time-of-Flight Depth Sensor in 0.18-μm CMOS," IEEE Journal of Solid-State Circuits; Feb. 2013; vol. 48, No. 2.
Extended European Search Report issued in European Patent Application No. 18775203.5, dated Mar. 9, 2020.

* cited by examiner

SOLID-STATE IMAGING DEVICE

CROSS-REFERENCE OF RELATED APPLICATIONS

This application is the U.S. National Phase under 35 U.S.C. § 371 of International Patent Application No. PCT/JP2018/010690, filed on Mar. 19, 2018, which in turn claims the benefit of Japanese Application No. 2017-064142, filed on Mar. 29, 2017, the entire disclosures of which Applications are incorporated by reference herein.

TECHNICAL FIELD

The present disclosure relates to a solid-state imaging device configured to be capable of acquiring distance information.

BACKGROUND ART

A solid-state imaging device has been so developed that efforts focus on capturing an image at high sensitivity and with high definition. In addition to this, a solid-state imaging device having the function of acquiring information on the distance from the solid-state imaging device has been introduced in recent years. An image to which the distance information is added allows sensing of three-dimensional information on a target to be imaged with the solid-state imaging device. For example, in a case where an image of a person is captured, a gesture can be three-dimensionally sensed, which means that the solid-state imaging device can be used as an input device of a variety of apparatuses. As another example, the solid-state imaging device incorporated in an automobile allows recognition of the distance to an object or a person present around the automobile and is therefore applicable, for example, to collision prevention and automatic driving.

There are a variety of methods used to measure the distance from a solid-state imaging device to an object. Among them, there is a time-of-flight (TOF) method for measuring the period from the point of time when light is radiated from a point in the vicinity of the solid-state imaging device toward an object to a point of time when the light is reflected off the object and returns to the solid-state imaging device. Comparison of the TOF method with another method, such as a compound eye method, shows that the TOF method has a disadvantage of requirement of a light source as well as the solid-state imaging device. On the other hand, the TOF method has an advantage of the ability to measure the distance to a remote object with high resolution by using a high-power light source. A technology described, for example, in PTL 1 shows a method for applying the TOF method to a solid-state imaging device to obtain three-dimensional information.

In PTL 1, three-dimensional information is produced by determining a difference between projection light (optical pulse signal) reflected off an object and background light obtained by turning off the projection light and using a phase difference derived from the difference described above by using a plurality of transfer gates. In the following description, the method described above is called a pulse phase method.

CITATION LIST

Patent Literature

PTL 1: Japanese Unexamined Patent Application Publication No. 2004-294420

SUMMARY OF THE INVENTION

Technical Problems

The present inventors have, however, noticed that the pulse phase method has the following problems.

As a first problem with the pulse phase method, the dynamic range is narrow. In other words, the pulse phase method has a small range of measurable distance. The intensity of the received light is proportional to the square of the distance to the object. For example, the intensity ratio between light received from an object at a distance of 1 m and light received from the same object at a distance of 100 m is 10000:1. On the other hand, the number of electrons in a single pixel of a solid-state imaging device in the situation in which the pixel is saturated is typically about 10000. Therefore, in a case where optical conditions are so set as to be capable of sensing the distance of 100 m, the light received from the object at the distance of 1 m undesirably saturates the pixel, and information on the phase of the pulses is lost. In a case where there is strong background light, the saturation is more likely to occur.

As a second problem with the pulse phase method, it has poor tolerance to strong background light. The second problem will be specifically described below. For example, in the driving operation sequence described in FIG. 4 in PTL 1, the pulse width of projection light is determined in accordance with the distance measurement range. For example, in a case where the distance measurement range is 100 m, 667 nanoseconds are required as the pulse width of the projection light, and this width cannot be shortened. On the other hand, the magnitude of a background light component signal increases in proportion to the pulse width of the projection light, and the magnitude of optical shot noise in the background light component signal is proportional to the square root of the background light component. There is therefore a case where the magnitude of the background light component signal is roughly equal to that of the signal of the light reflected off an object. In this case, the optical shot noise described above has a very large magnitude, preventing the distance measurement with sufficient accuracy.

The present disclosure has been made in view of the points described above, and an object of the present disclosure is to achieve a small-area solid-state imaging device having a wide measurable distance range and capable of distance measurement even under a strong background light environment.

Solutions to Problems

A solid-state imaging device according to an aspect of the present disclosure includes: a plurality of pixels that are arranged two-dimensionally, wherein the plurality of pixels each include a light receiving circuit that includes a light receiving element and outputs a light reception signal, the light reception signal changing in accordance with whether or not incident light arrives at the light receiving element in a light exposure period; a counter circuit that counts, based on the light reception signal, a number of the arrivals indicating how many times incident light arrives at the light receiving element, and outputs a result of the counting as a count; a comparison circuit that receives a threshold setting signal, sets a threshold corresponding to the count based on the threshold setting signal, and outputs a comparison signal that is ON when the count is greater than the threshold; and a storage circuit that receives a time signal corresponding to a distance measuring period taken by the comparison circuit and the counter circuit to perform distance measuring, and stores the time signal as a distance signal when the comparison signal is ON, and wherein the light receiving circuit, the counter circuit, the comparison circuit, and the storage circuit each include a transistor having a first conductivity type.

The configuration described above allows a solid-state imaging device having a wide measurable distance range and capable of distance measurement even under a strong background light environment to be achieved. Further, the configuration in which a transistor included in each of the light receiving circuit, the counter circuit, the comparison circuit, and the storage circuit has the first conductivity type eliminates the necessity of formation of a well for transistors having a conductivity type different from the first conductivity type, whereby the circuit area of each of the pixels can be reduced.

Advantageous Effects of Invention

The solid-state imaging device according to the present disclosure provides a wide measurable distance range and allows distance measurement even under a strong background light environment. Further, the thus configured solid-state imaging device can be a small-area device.

DESCRIPTION OF EXEMPLARY EMBODIMENTS

Hereinafter, certain exemplary embodiments are described in greater detail with reference to the accompanying Drawings. It should be noted that all the embodiments described below are generic and specific examples of the present disclosure. Numerical values, shapes, materials, constituent elements, arrangement positions and the connection configuration of the constituent elements, steps, the order of the steps, and the like described in the following embodiments are merely examples, and are not intended to limit the present disclosure. The present disclosure is characterized by the appended claims. Therefore, among the constituent elements in the following embodiments, constituent elements that are not described in independent claims that show the most generic concept of the present disclosure are described as elements constituting more desirable configurations.

Embodiment 1

—Configuration of Solid-State Imaging Device—

Figure 1:
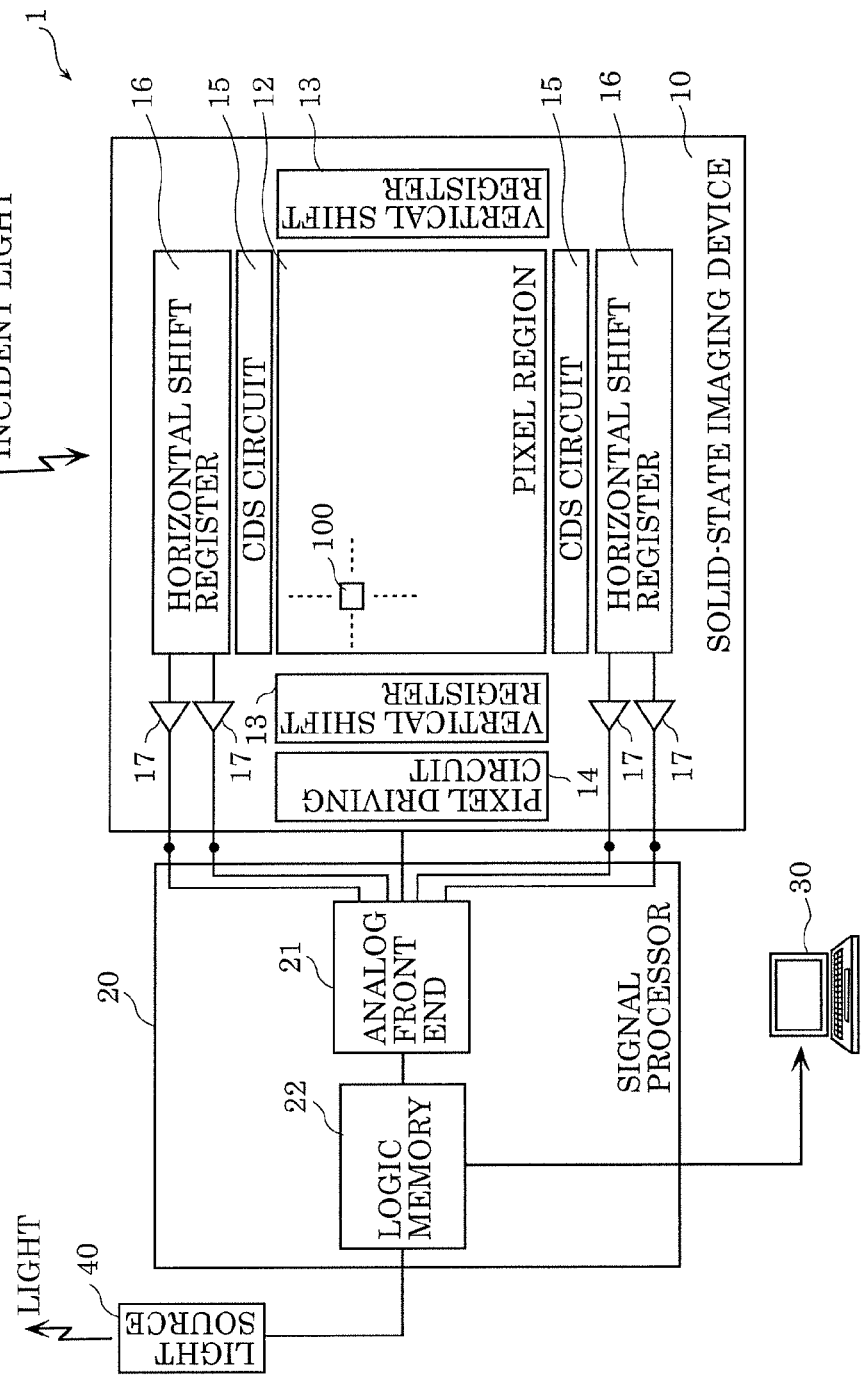
FIG. 1 is a schematic view showing an example of the configuration of a distance measuring apparatus including a solid-state imaging device according to Embodiment 1.

FIG. 1 is a schematic view showing an example of the configuration of distance measuring apparatus 1 including solid-state imaging device 10 according to the present embodiment. Distance measuring apparatus 1 includes solid-state imaging device 10, signal processor 20, computation apparatus 30, and light source 40, as shown in FIG. 1.

Solid-state imaging device 10 includes pixel region 12, vertical shift register 13, pixel driving circuit 14, corrected double sampling (CDS) circuit 15, horizontal shift resister 16, and output circuit 17.

Figure 2:
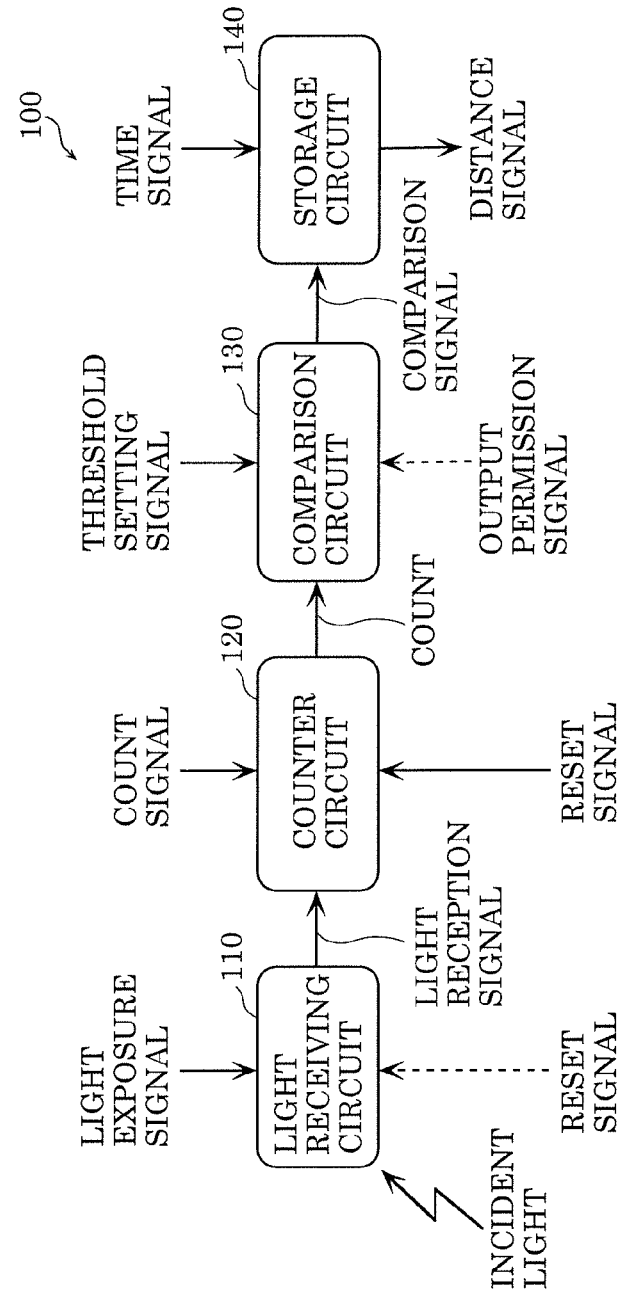
FIG. 2 is a block diagram showing an example of the configuration of each pixel according to Embodiment 1.
Figure 3:
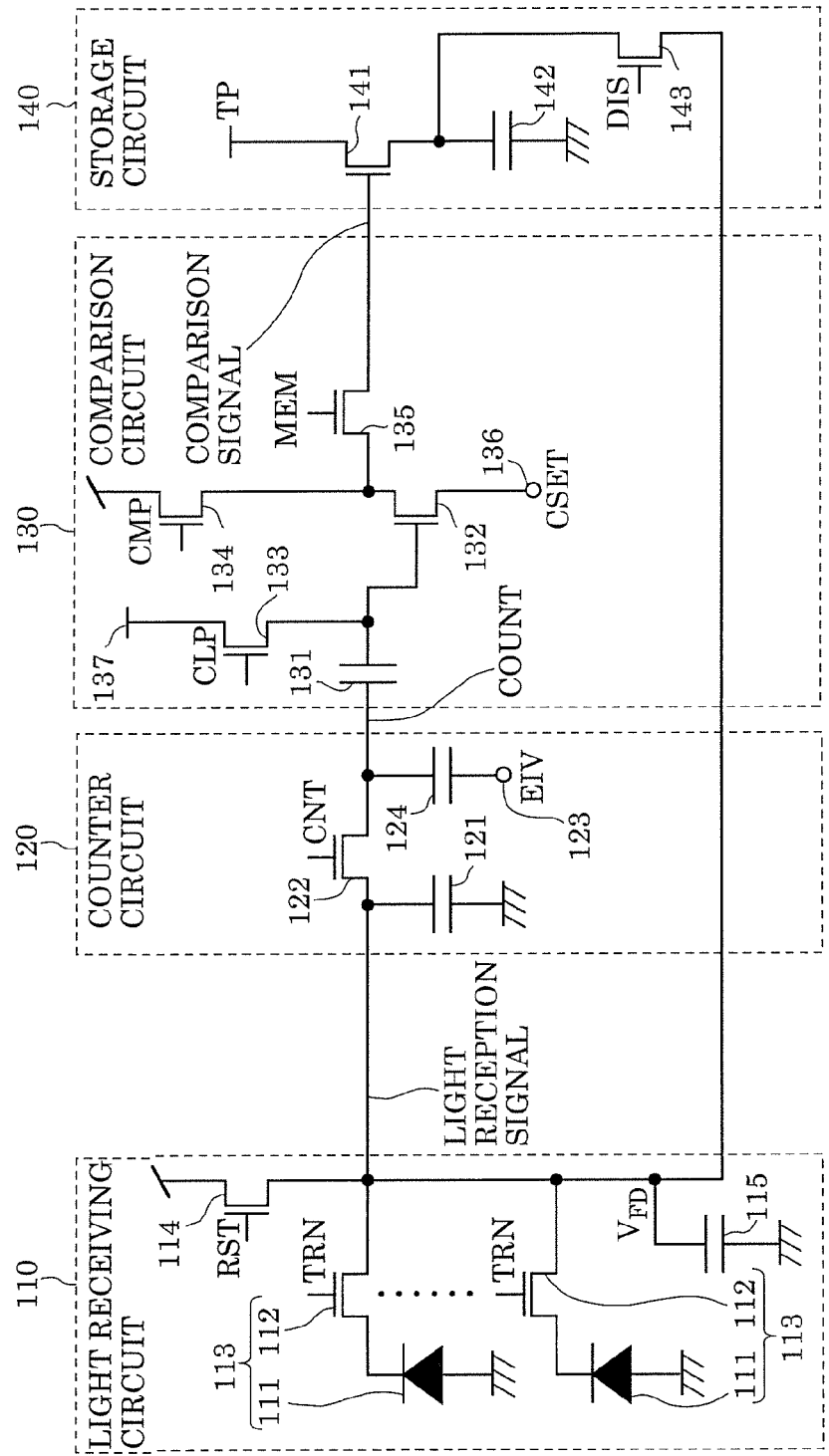
FIG. 3 is a circuit diagram showing an example of the configuration of each pixel according to Embodiment 1.

Pixels 100, which are each shown in FIGS. 2 and 3, are two-dimensionally arranged in pixel region 12.

Vertical shift register 13 selects pixels 100 in a specific row in pixel region 12. The selection function is primarily used to sequentially output distance signals acquired at the specific pixels from these pixels 100.

Pixel driving circuit 14 is used to simultaneously control all pixels 100.

CDS circuit 15 is a circuit for removing an offset component contained in the distance signal that is an output from each of pixels 100. The offset component varies among pixels 100 in some cases.

Horizontal shift resister 16 is a circuit for sequentially selecting, out of the outputs from pixels 100, outputs to be extracted in the form of a column to an external apparatus.

Output circuit 17 outputs the distance signal output from pixel 100 selected by vertical shift register 13 and horizontal shift resister 16. Vertical shift register 13 and horizontal shift resister 16 may amplify a signal to be output therefrom as required. The present embodiment is described with reference to a case where solid-state imaging device 10 accommodates four output circuits 17, but the present disclosure is not limited to this embodiment. For example, the number of output circuits 17 in solid-state imaging device 10 may be three or fewer or five or greater.

Signal processor 20 includes analog front end 21 and logic memory 22.

Analog front end 21 converts an analog output signal that is a signal output from each of output circuits 17 of solid-state imaging device 10 into a digital output signal. Analog front end 21 further reorders the output signals as required and outputs the swapped output signals to logic memory 22. In a case where the output signals from output circuits 17 are digital signals, no AD conversion function is required. In this case, analog front end 21 may be removed from signal processor 20, but it is necessary to reorder the output signals. The distance signals output from signal processor 20 are input to computation apparatus 30.

Computation apparatus 30 is, for example, a computer and forms three-dimensional information on the surroundings of solid-state imaging device 10 based on the distance signals received from signal processor 20.

Light source 40 projects light to a location from which a user desires to obtain the three-dimensional information. Light source 40 has a built-in mechanism that diffuses light as required to irradiate the entire location from which the user desires to obtain the three-dimensional information with the diffused light. Light source 40 outputs pulse-shaped light containing pulses along the temporal axis (hereinafter simply referred to as pulsed light). The time when the pulsed light is output and the width of the pulsed light are controlled by signal processor 20. Signal processor 20 further controls solid-state imaging device 10 in synchronization with the control of light source 40. Solid-state imaging device 10 controls pixels 100 incorporated therein via pixel driving circuit 14 and other components in accordance with a control signal from signal processor 20.

—Configuration of Pixels—

FIG. 2 is a block diagram showing an example of the configuration of each of pixels 100 incorporated in solid-state imaging device 10 according to Embodiment 1, and FIG. 3 is a circuit diagram showing an example of the configuration of each of pixels 100. A variety of signals described below are defined as follows: "ON" refers to a signal that controls a transistor so controlled as to be turned on (high-level signal in the description), and "OFF" refers to a signal that controls a transistor so controlled as to be turned off (low-level signal in the description). "Turned ON" refers to application of a signal having a high-level voltage value, and "Turned OFF" refers to application of a signal having a low-level voltage value.

Pixels 100 are each formed of the following four blocks: light receiving circuit 110, which receives incident light; counter circuit 120; comparison circuit 130; and storage circuit 140 as shown in FIG. 2. The four blocks will each be described below in terms of specific configuration and function with reference to FIG. 3. It is noted that the specific configuration described below is presented by way of example, and the configuration of each of pixels 100 is not limited to that described below. For example, another configuration having a similar function may be employed.

Light receiving circuit 110 has the function of outputting, to counter circuit 120, a light reception signal that changes in accordance with whether or not incident light arrives at light receiving element 111 in a predetermined light exposure period. Specifically, light receiving circuit 110 includes light receiving element 111, N-type transfer gate transistor 112, the N-type being a first conductivity type, N-type reset transistor 114, and received light storage capacitor 115. Light receiving element 111 is, for example, a photodiode. Light receiving element 111 and transfer gate transistor 112 are connected in series to each other to form light receiver set 113, and a plurality of light receivers 113 are connected in parallel to one another between the ground and the output line of light receiving circuit 110. The source of reset transistor 114 is connected to the input of counter circuit 120 via the output of light receiving circuit 110. The drain of reset transistor 114 is connected to a power source, and high-active reset signal RST is supplied to the gate of reset transistor 114. Light exposure signal TRN is supplied to the gate terminal of each of transfer gate transistors 112.

The light reception signal output from light receiving circuit 110 is desirably a binarized signal that changes in accordance with whether or not incident light arrives, and the following description will be made on the assumption that the light reception signal is a binary signal. The light reception signal may instead be a signal that changes in accordance with the magnitude of the incident light. In this case, for example, the signal may be handled as if it had two values separated by a predetermined threshold specified in a circuit-related manner. Further, light receiving circuit 110 can arbitrarily set the photoelectric conversion period in accordance with the light exposure signal TRN output from pixel driving circuit 14. The case where light receiving element 111 receives incident light is also expressed as the case where "a light reception signal is generated," whereas the case where light receiving element 111 receives no incident light is also expressed as the case where "no light reception signal is generated." Light receiving circuit 110 may have a configuration in which no reset function is added, that is, a configuration in which no reset transistor 114 is provided. In this case, light receiving circuit 110 desirably has the function of resetting the electric signal in light receiving circuit 110 simultaneously with the timing when the light reception signal is output or within a sufficiently short period after the light reception signal is output.

Counter circuit 120 includes charge accumulating capacitor 121, which is connected to and between the output lines of light receiving circuit 110 and the ground, counter transistor 122, which is located between the input and the output of counter circuit 120, and counter capacity 124, which is connected to and between the output node of counter transistor 122 and counter capacity control terminal 123. Counter circuit 120 has the function of counting the number of arrivals of the incident light based on the light reception signal input from light receiving circuit 110 and outputting the count. Specifically, counter transistor 122 is ON for the period in which count signal CNT output from pixel driving circuit 14 is ON, and counter circuit 120 senses the light reception signal from light receiving circuit 110. Counter circuit 120 is configured to increment the count by one in the case where the light reception signal is generated. That is, counter circuit 120 counts the number of arrivals indicating how many times reflected light arrives at light receiving circuit 110. Further, the function of resetting the count may be added to counter circuit 120. Counter circuit 120 is reset in accordance with a reset signal (see FIG. 2) output from pixel driving circuit 14.

Comparison circuit 130 includes input transistor 132, which has a gate to which the output of counter circuit 120 is connected via DC blocking capacitor 131, clamp transistor 133, inversion transistor 134, and threshold setting transistor 135. Input transistor 132, clamp transistor 133, inversion transistor 134, and threshold setting transistor 135 are each an N-type transistor.

Inversion transistor 134 and input transistor 132 are connected in series to each other between the power source and permission signal input terminal 136, to which output permission signal CSET is input. Inversion control signal CMP is supplied to the gate of inversion transistor 134. Clamp transistor 133 is located between clamp terminal 137, to which predetermined clamp potential is supplied, and the gate of input transistor 132, and clamp signal CLP is supplied to the gate of clamp transistor 133. The clamp voltage is set, for example, at voltage higher than a threshold voltage of input transistor 132. An intermediate node between inversion transistor 134 and input transistor 132 is connected to the input of storage circuit 140 via threshold setting transistor 135. Output control signal MEM is supplied to the gate of threshold setting transistor 135. Output control signal MEM is a signal supplied from pixel driving circuit 14. Comparison circuit 130 having the circuit configuration described above achieves a comparison function of evaluating whether or not the count output from counter circuit 120 is greater than a predetermined threshold only by N-type transistors.

Further, comparison circuit 130 may be configured to be capable of setting a threshold corresponding to the count input from counter circuit 120 when a threshold setting signal (see FIG. 2) output from pixel driving circuit 14 is ON. Comparison circuit 130 has the function of making a comparison signal ON, the comparison signal being a signal output from comparison circuit 130, when the input count is greater than the set threshold. Output permission signal CSET may be input to comparison circuit 130. In this case, comparison circuit 130 is configured to output an ON comparison signal only when output permission signal CSET is ON.

Storage circuit 140 includes N-type distance signal switching transistor 141, distance storage capacitor 142, and N-type distance selection transistor 143. Specifically, distance signal switching transistor 141 has a drain connected to terminal TP and a source connected to the ground via distance storage capacitor 142. A time signal output from pixel driving circuit 14 is supplied to terminal TP. The time signal is so set, for example, based on a k-th period (k is arbitrary natural number) in a distance measuring period as to have voltage corresponding to k in a one-to-one relationship. The comparison signal output from comparison circuit 130 is supplied to the gate of distance signal switching transistor 141. Therefore, at the timing when the comparison signal is turned ON, the value of the time signal is stored in distance storage capacitor 142.

Distance selection transistor 143 is located between the output node of storage circuit 140 (node between distance signal switching transistor 141 and distance storage capacitor 142) and the output of light receiving circuit 110. Output control signal DIS output from pixel driving circuit 14 is supplied to the gate of distance selection transistor 143. When distance selection transistor 143 is turned ON, storage circuit 140 outputs the time signal stored in distance storage capacitor 142 as the distance signal. Received light storage capacitor 115 is connected to a side of distance selection transistor 143 that is the side facing light receiving circuit 110.

—Operation of Solid-State Imaging Device—

Figure 4:
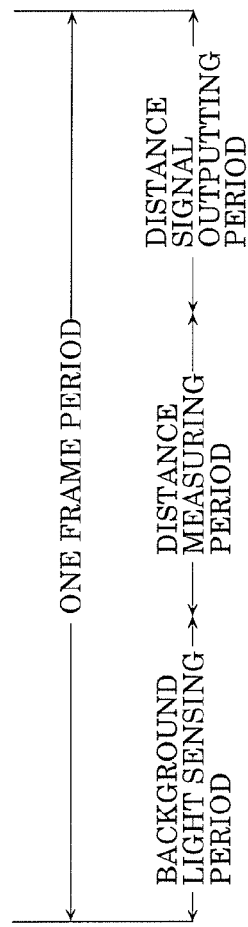
FIG. 4 shows an operation period contained in the period corresponding to one frame produced by the solid-state imaging device Embodiment 1.

The operation of solid-state imaging device 10 according to the present embodiment will next be specifically described. FIG. 4 shows an operation period contained in the period corresponding to one frame produced by solid-state imaging device 10.

The one frame period is divided into a background light sensing period, a distance measuring period, and a distance signal outputting period, as shown in FIG. 4. Solid-state imaging device 10 repeats the background light sensing period, the distance measuring period, and the distance signal outputting period in the presented order.

Figure 5:
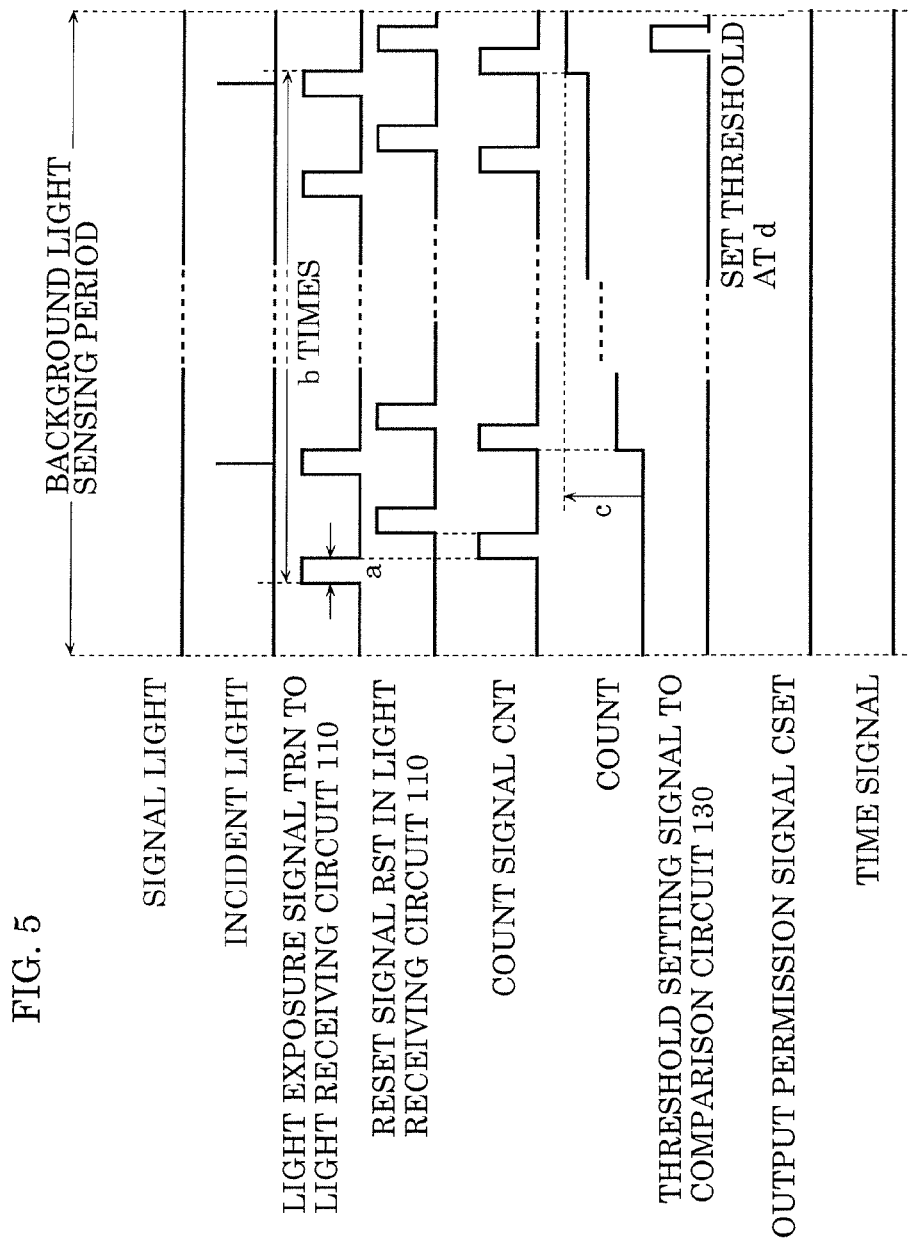
FIG. 5 describes the operation sequence in a background light sensing period.
Figure 6:
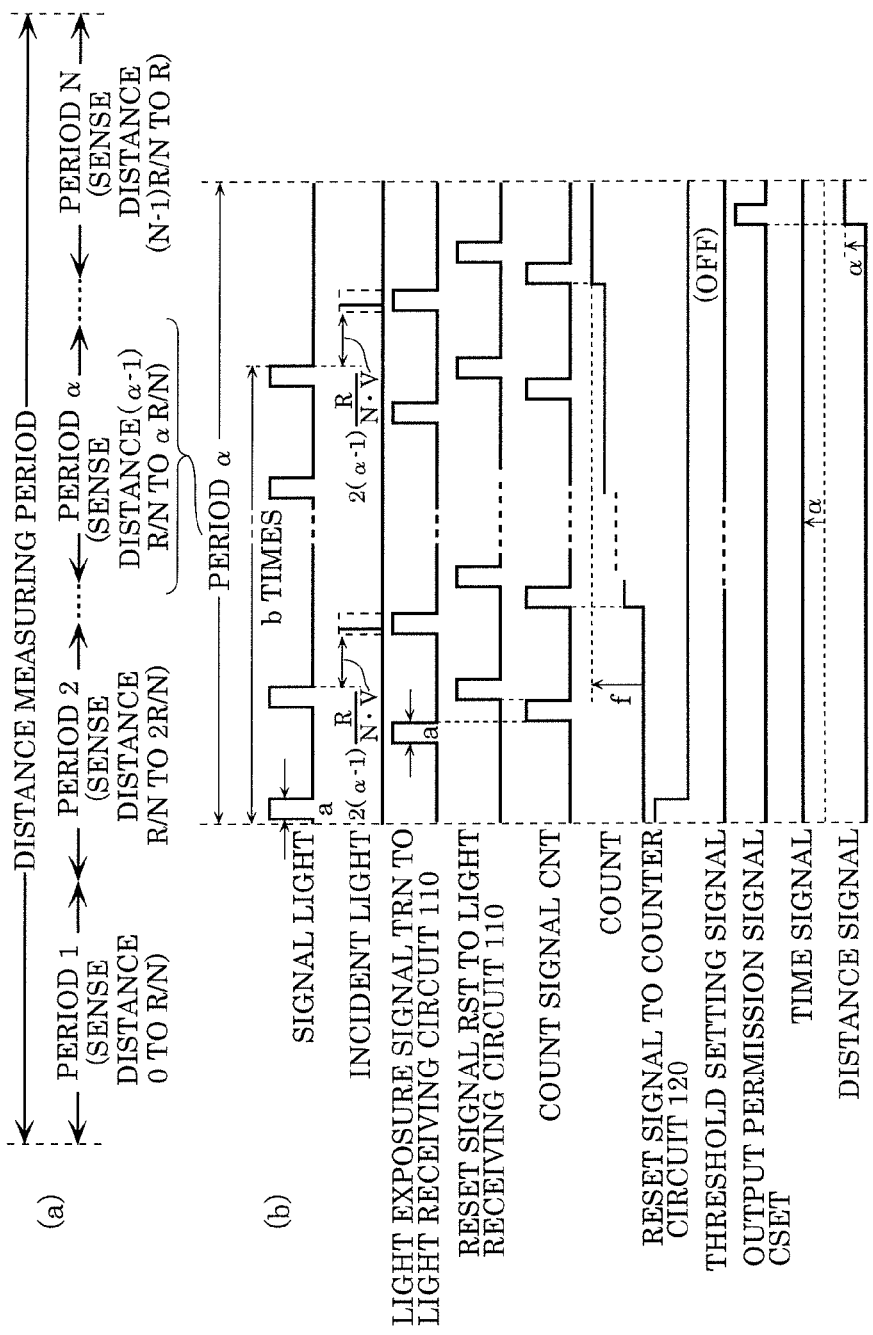
FIG. 6 describes the operation sequence in a distance measuring period.

FIG. 5 describes the operation sequence of solid-state imaging device 10 according to the present embodiment in the background light sensing period. FIG. 6 describes the operation sequence of solid-state imaging device 10 according to the present embodiment in the distance measuring period.

In the background light sensing period, the output from light source 40 is first caused to remain OFF in solid-state imaging device 10, as shown in FIG. 5. In this state, light receiving circuit 110 in any of pixels 100 shown in FIG. 2 senses incident light. At this point, in light receiving circuit 110, background light present in the surrounding environment (typically, sunlight in daytime outdoor environment) is reflected off an object under imaging (target under measurement), and the reflected light is incident on light receiving circuit 110. A circuit (not shown) disposed in association with light receiving circuit 110 sets the period for which the photoelectric conversion is performed (light exposure period) at "a" seconds and receives the background light. If light arrives at the pixel in the "a" seconds, light receiving circuit 110 sets to be in the state corresponding to the case where "the light reception signal is generated." The count signal is then turned ON. At this point, in the case where the light reception signal is generated, the count is incremented by one.

Thereafter, reset signal RST in light receiving circuit 110 is turned ON to reset the electric signal and the light reception signal in light receiving circuit 110. The series of steps described above are repeated "b" times (b is arbitrary natural number). That is, counter circuit 120 counts how many times light has arrived in the light exposure repeated "b"-times described above, and the count is stored. In the description, it is assumed that light has arrived "c" times. It is, however, assumed that "a" described above is sufficiently short or the incident light is sufficiently weak so that the incident light can be expressed in the form of several photons and is intermittently incident. Typically, the assumption is fully satisfied in a case where "a" is shorter than or equal to several tens of nanoseconds.

Next, the threshold setting signal supplied to comparison circuit 130 is turned ON, and a threshold corresponding to "c", which is the value of the output from counter circuit 120, is set. The threshold may be "c" itself, which is the value of the output from counter circuit 120, but is set at d=c+e (e is arbitrary positive value) in the description.

Solid-state imaging device 10 then performs the operation in the distance measuring period. It is assumed as a distance measurement range in the description that solid-state imaging device 10 detects an object that falls within a range from a location very close to solid-state imaging device 10 to a location separate therefrom by R meters. It is further assumed that the resolution of the distance measurement is R/N meters (N is integer greater than or equal to one). To detect an object within the distance measurement range with the resolution described above, the following steps are carried out in the distance measuring period, as shown in FIG. 6.

The distance measuring period is further divided into N periods, as shown in FIG. 6. The divided periods are called period 1, in which an object at a distance from 0 to R/N meters is sensed, period 2, in which an object at a distance from R/N to 2R/N meters is sensed, ... a period α, in which an object at a distance from (α−1)R/N to αR/N meters is sensed (α is integer greater than or equal to one or fewer than or equal to N), ... a period N, in which an object at a distance from (N−1)R/N to R meters is sensed. The distance measuring period is not necessarily divided as described above. For example, the distance measuring period may be divided into periods having unequal lengths, that is, how to divide the distance measuring period may be so set that at least part of the divided distance measuring periods differs from the other periods in terms of length. The following description will be made on the assumption that the distance measuring period is divided into N periods having equal lengths as described above for convenience of description.

The operation in the period α will next be described. First, the reset signal to counter circuit 120 is turned ON to reset the count. The time signal input to storage circuit 140 is set at α. The value of the time signal input to storage circuit 140 can be arbitrarily set, and the values of the time signal in periods 1 to N only needs to differ from one another. The value of the time signal may further continuously change. In FIG. 6, the description will be made on the assumption that the time signal is fixed in period α for convenience of description.

Further, light source 40 is so controlled as to project optical pulses each having a width of "a" seconds. If the light is reflected off an object corresponding to the distance to be measured in period α, that is, an object in front of solid-state imaging device 10 by the distance ranging from (α−1)R/N to αR/N meters and incident on a pixel in solid-state imaging device 10, optical pulses reflected off the object (hereinafter also referred to as received light) arrive at solid-state imaging device 10 after a delay of

[Mathematical Expression 1]

$$2(\alpha - 1)\frac{R}{N \cdot V} \quad \text{(Expression 1)}$$

with respect to the time when the light source emits the optical pulses (hereinafter also referred to as projection light). In the expression, V represents the speed of light. Therefore, a setting in which light exposure signal TRN to light receiving circuit 110 causes the light exposure to start at the time described above and last for "a" seconds allows sensing of the light received from an object within the distance range described above. Counter circuit 120 then counts the number of times when the received light is sensed in the form of count signal CNT, that is, the number of arrivals of the light. Reset signal RST to light receiving circuit 110 then resets the count.

The light exposure is repeated "b" times in accordance with the procedure described above, and counter circuit 120 counts the number of arrivals of the light. If no object is present within the distance range corresponding to period α, the expectation value of the count is "c", which represents the background light component and is smaller than threshold d, so that the operation of downstream comparison circuit 130 does not change. On the other hand, in a case where an object is present within the distance range corresponding to period α, the expectation value of the count is "f", which is greater than "c". That is, in a case where the intensity of the received light is sufficiently large,

[Mathematical Expression 2]

$$f > d \quad \text{(Expression 2)}$$

is satisfied.

The output permission signal to comparison circuit 130 is then made ON. In a case where Expression 2 described above is satisfied, the comparison signal is turned ON, and the time signal is stored as the distance signal. On the other hand, in a case where Expression 2 described above is not satisfied, the stored distance signal (or initial value in a possible case) does not change.

Period (α+1) then follows, and the distance measuring period ends at period N. At this point, storage circuit 140 in each of the pixels stores a signal corresponding to the distance to the object imaged at the pixel, that is, the distance signal.

Finally, the distance signal stored in each of pixels 100 is output in the distance signal outputting period. In the case of solid-state imaging device 10 in distance measuring apparatus 1 shown in FIG. 1, vertical shift register 13 and horizontal shift resister 16 sequentially select a pixel, which outputs the distance signal. Signal processor 20 and other components process the distance signal to produce three-dimensional information (that is, distance image). The distance-image-producing signal from solid-state imaging device 10 is also simply called a distance image in some cases in the following description.

In the above description, it is assumed that the light exposure period in the background light sensing period is equal to the light exposure period in the distance measuring period or the number of optical pulses in the background light sensing period is equal to the number of optical pulses in the distance measuring period, but the present disclosure is not limited to this. It is, however, noted in a case where the exposure periods or the number of optical pulses differ from each other that the requirement that establishes Expression 2 is changed in accordance with the different exposure periods or number of optical pulses.

Further, the period by which light exposure signal TRN is delayed with respect to the time when the optical pulses are emitted in each of the periods is not limited to the value described above, and a variety of variations are readily conceivable.

A description will next be made of a reason why the distance measurement performed by solid-state imaging device 10 according to the present embodiment provides a wider distance measurement dynamic range than that provided by the pulse phase method used in the literatures of related art.

In the pulse phase method, which is in simplified consideration a method for measuring the distance based on a change in intensity of the received light, the distance is immeasurable in a case where the intensity is higher than the saturation level of a pixel. The intensity of the received light is inversely proportional to the square of the distance to an object but proportional to the reflectance of the object. For example, consider a case where the maximum measurable distance is 100 meters and the reflectance of an object under measurement ranges from 10 to 100%. In this case, the ratio of the intensity of the received light from an object located at a distance of 1 meter and having a reflectance of 100% to the intensity of the received light from an object located at a distance of 100 meters and having a reflectance of 10% is as large as 100000:1. On the other hand, the number of electrons in a single pixel of a typical solid-state imaging device in the situation in which the pixel is saturated is typically about 10000, which means that the two objects described above cannot be measured at the same time.

On the other hand, in the distance measurement performed by solid-state imaging device 10, whether or not an object is measurable depends only on the condition that the received signal is intense enough to satisfy Expression 2 but does not depend at all on a change in the intensity of the received light due to the distance to the object and the reflectance thereof. It can therefore be said that the distance measurement performed by solid-state imaging device 10 provides a wider distance dynamic range than the pulse phase method.

The following description will be made of a reason why the distance measurement performed by solid-state imaging device 10 provides better tolerance to the intensity of the background light than the pulse phase method. It is assumed as the measurement conditions that an object that falls within the range from a location very close to solid-state imaging device 10 to a location separate therefrom by R meter is detected, as described above. It is further assumed that the measurement accuracy of R/N meters is ensured.

In this case, measurement of an object at the largest distance, that is, an object separate by R meters is most affected by the background light because the intensity of the background light reflected off the object does not depend on the distance to the object, but the light received from the light source is inversely proportional to the square of the distance. That is, the SN ratio of the received light decreases as the distance increases.

The conditions under which the received light is measurable are calculated below. It is assumed in the following calculation that the unit of energy is the number of photons. It is assumed in the calculation that shot noise in the background light is a dominant noise component, and that shot noise in the received light is sufficiently smaller than the shot noise in the background light and is therefore negligible.

Let S be the number of peak incident photons of the light received by a single pixel per unit period (it is the value obtained by converting the peak incident power into the number of photons). S is determined by the energy provided by the light source, the reflectance of an object, and the distance to the object. A component resulting from the background light reflected off the object is superimposed on the received light. It is assumed that the number of photons in the incident light component resulting from the background light per unit period is B. In the pulse phase method, in which the pulse width needs to satisfy

[Mathematical Expression 3]

$$\frac{2R}{V} \quad \text{(Expression 3)}$$

Let M be the number of pluses, total energy T of the light received by a single pixel is therefore expressed by

[Mathematical Expression 4]

$$T = S \cdot \frac{2R}{V} \cdot M \quad \text{(Expression 4)}$$

On the other hand, the total energy of the background light component is expressed by

[Mathematical Expression 5]

$$B \cdot \frac{2R}{V} \cdot M \quad \text{(Expression 5)}$$

and optical shot noise expressed by

[Mathematical Expression 6]

$$\sqrt{B \cdot 2\frac{R}{V} \cdot M} \quad \text{(Expression 6)}$$

is superimposed on the total energy of the background light component. The condition necessary for calculation of the accuracy of R/N meters by using measured energy T of the received light is that T can be measured with an accuracy of T/N or smaller. That is, the condition is expressed by

[Mathematical Expression 7]

$$\frac{T}{N} > \sqrt{B \cdot 2\frac{R}{V} \cdot M} \quad \text{(Expression 7)}$$

$$T > N\sqrt{B \cdot 2\frac{R}{V} \cdot M}$$

On the other hand, an expression corresponding to Expression 7 for the distance measurement performed by solid-state imaging device 10 is derived below. First, the width of a single optical pulse and the light exposure period for sensing the optical pulse only need to be shorter than or equal to the period required for the optical pulse to travel over twice the distance range corresponding to one period at the speed of light, that is, the period is expressed by

[Mathematical Expression 8]

$$2\frac{R}{VN} \quad \text{(Expression 8)}$$

It is assumed that the width of a single optical pulse and the light exposure period for sensing the optical pulse are equal to the period expressed by Expression 8. The total energy of the received light incident on a single pixel in one period is expressed by

[Mathematical Expression 9]

$$\frac{T}{N} \quad \text{(Expression 9)}$$

It is noted that the number of pulses in each period is equal to the peak energy. At the same time, the optical energy provided by the incident background light is expressed by

[Mathematical Expression 10]

$$B \cdot 2\frac{R}{VN} \cdot b \quad \text{(Expression 10)}$$

and the optical shot noise in the light is expressed by

[Mathematical Expression 11]

$$\sqrt{B \cdot 2\frac{R}{VN} \cdot b} \quad \text{(Expression 11)}$$

It is therefore necessary that threshold d is greater than the sum of the values derived from Expressions 10 and 11. In addition, to avoid a situation in which false determination of arrival of the received light in a period in which no arrival of the received light occurs, threshold d is desirably further increased. According to a statistical theory, the probability of a situation in which the optical shot noise expressed by Expression 11 is greater than γ times the shot noise expressed by Expression 11 is 16% for γ=1, 2.5% for γ=2, and 0.15% for γ=3. When the probability is smaller than 1/N, the false determination described above does not occur. For example, in the case of N=100, γ=3 may suffice. That is, since threshold d is expressed by

[Mathematical Expression 12]

$$d = B \cdot 2\frac{R}{VN} \cdot b + \gamma \cdot \sqrt{B \cdot 2\frac{R}{VN} \cdot b} \quad \text{(Expression 12)}$$

the measurement requirement with no false determination is expressed by

[Mathematical Expression 13]

$$\frac{T}{N} > \gamma \cdot \sqrt{B \cdot 2\frac{R}{VN} \cdot b} \quad \text{(Expression 13)}$$

For simplicity, consider a case where the total number of pulses in the distance measurement performed by solid-state imaging device 10 is equal to that in the measurement performed in accordance with the pulse phase method. That is, in the distance measurement performed by solid-state imaging device 10, consider a case in which M=Nb is satisfied, where M represents the number of pulses in the pulse phase method, N represents the number of measuring periods, and b represents the number of pulses in each of measuring periods, and Expression 13 is deformed into

[Mathematical Expression 14]

$$T > \frac{\gamma}{N} \sqrt{B \cdot 2\frac{R}{V} \cdot M} \quad \text{(Expression 14)}$$

Comparison between Expressions 14 and 7 shows that at least in the case of N>γ, the method in accordance with which solid-state imaging device 10 performs distance measurement allows measurement with a smaller amount of light source energy than that in the pulse phase method, that is, the method in accordance with which solid-state imaging device 10 performs distance measurement is more tolerant to the background light than the pulse phase method. In the case of gesture recognition, obstacle sensing achieved by solid-state imaging device 10 incorporated in an automobile, and other applications, using the distance measurement performed by solid-state imaging device 10 requires at least N>100, whereby a smaller amount of light source energy than that in the pulse phase method practically suffices.

In the following sections, a description will next be made of a reason why high distance measurement accuracy is achieved even in the case of a large background light component. It is assumed in the following description that a primary noise component is the optical shot noise in the received light component and the other noise is negligible.

In the pulse phase method, assume that the optical shot noise component in the received light component is roughly equal to the optical shot noise with respect to the optical energy T and is expressed by

[Mathematical Expression 15]

$$\sqrt{S \cdot 2\frac{R}{V} \cdot M} \quad \text{(Expression 15)}$$

The condition necessary for calculation of the accuracy of R/N meters is that T can be measured with the accuracy of T/N or smaller. That is, the condition is expressed by

[Mathematical Expression 16]

$$\frac{T}{N} > \sqrt{S \cdot 2\frac{R}{V} \cdot M} \quad \text{(Expression 16)}$$

$$S > \frac{V}{2RM} N^2$$

In the distance measurement performed by solid-state imaging device 10, it is assumed that M=Nb is satisfied for simplicity, and the number of photons received in a single measuring period is expressed by

[Mathematical Expression 17]

$$S \cdot 2\frac{R}{V}\frac{M}{N} \quad \text{(Expression 17)}$$

The condition necessary for the accuracy of R/N meters is that the optical energy received in a single measuring period is greater than or equal to one photon. That is, the condition is expressed by

[Mathematical Expression 18]

$$S > \frac{V}{2RM} N \quad \text{(Expression 18)}$$

Comparison between Expressions 16 and 18 shows that the distance measurement performed by solid-state imaging device 10 can be performed with a small amount of optical energy than the pulse phase method in the case of N>1. Conversely, provided that the optical energy is fixed, the distance measurement performed by solid-state imaging device 10 provides higher distance measurement accuracy.

As described above, solid-state imaging device 10 according to the present embodiment allows distance measurement with a wide measurable distance range even under a strong background light environment.

Further, in the present embodiment, the transistors that form light receiving circuit 110, counter circuit 120, comparison circuit 130, and storage circuit 140, which form each of pixels 100, are each an N-type transistor as shown in FIG. 3. The configuration described above, in which pixels 100 each include no P-type transistor as a component, eliminates the necessity of formation of an N-type well region for formation of a P-type-channel transistor, whereby the area of each of the pixels can be reduced. It is noted that light receiving circuit 110, counter circuit 120, comparison circuit 130, and storage circuit 140 can each instead be formed of P-type transistors and the same effects as those provided by the N-type-transistor-based configuration can be provided.

As described above, solid-state imaging device 10 in Embodiment 1 is solid-state imaging device 10 including a plurality of two-dimensionally arranged pixels 100, and pixels 100 each include light receiving circuit 110, which includes light receiving element 111 and outputs the light reception signal that changes in accordance with whether or not incident light arrives at light receiving element 111 in the light exposure period, counter circuit 120, which counts the number of arrivals of the incident light based on the light reception signal and outputs the result of the counting as a count, comparison circuit 130, which receives the threshold setting signal, sets a threshold corresponding to the count based on the threshold setting signal, and outputs the comparison signal that is turned ON when the count is greater than the threshold, and storage circuit 140, which receives the time signal corresponding to the distance measuring period that is a period taken by comparison circuit 130 and counter circuit 120 to perform distance measuring, and stores the time signal as the distance signal when the comparison signal is ON. Light receiving circuit 110, counter circuit 120, comparison circuit 130, and storage circuit 140 each include a transistor having a first conductivity type.

The configuration described above allows distance measurement with a wide measurable distance range even under a strong background light environment.

Comparison circuit 130 may include input transistor 132 having the first conductivity type. Input transistor 132 has a gate that receives the count. Input transistor 132 outputs the comparison signal that is turned ON when the count is greater than the threshold in the comparison operation period. Input transistor 132 may be inactive irrespective of the magnitude of the count in the period excluding the comparison operation period.

Embodiment 2

The configuration in Embodiment 1 provides high distance measurement accuracy, but in a case where the received light reflected off an object and the background light are very weak, the number counted by counter circuit 120 is greater than a correct value in some cases. Specifically, the case where the received light reflected off an object and the background light are very weak refers to a case where the number "c" of arrivals of the background light and the number "f" of arrivals of the projection light with respect to the number "b" of light exposure actions satisfy the following condition:

[Mathematical Expression 19]

$$b \gg c, f \qquad \text{(Expression 19)}$$

Figure 7:
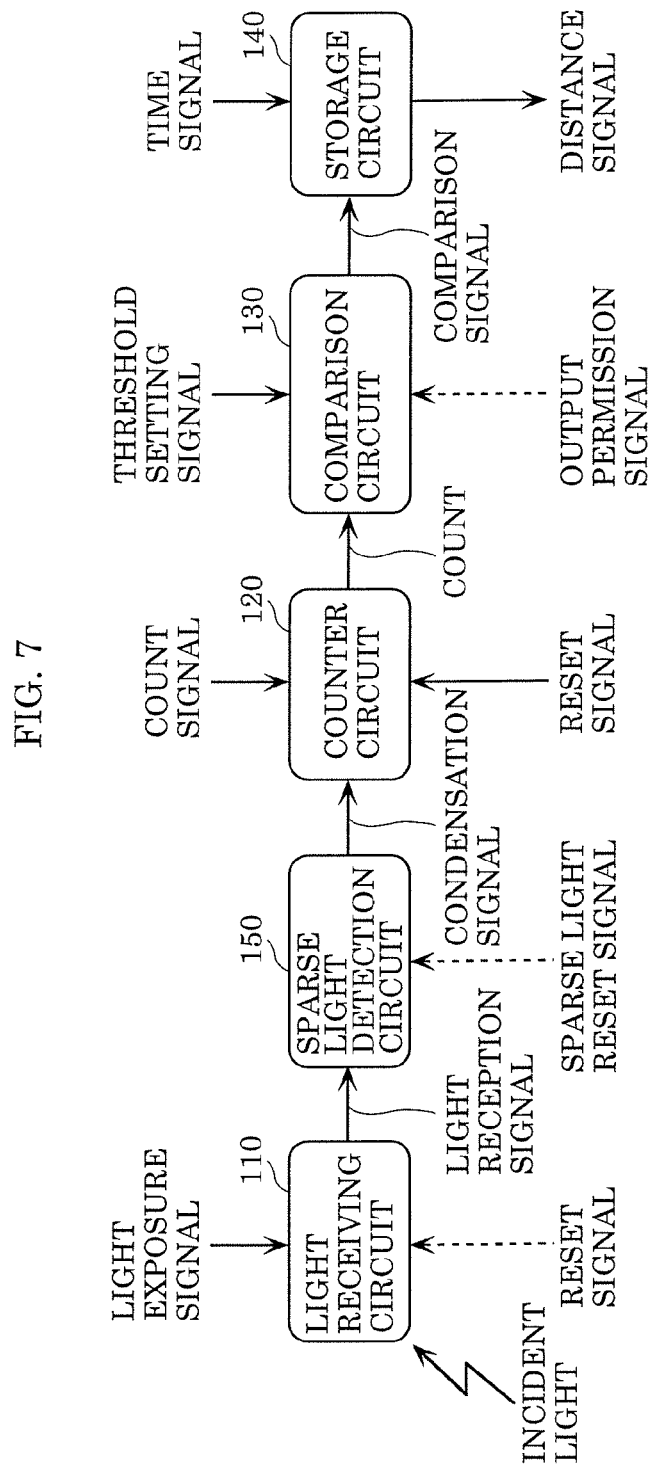
FIG. 7 is a block diagram showing an example of the configuration of each pixel according to Embodiment 2.
Figure 8:
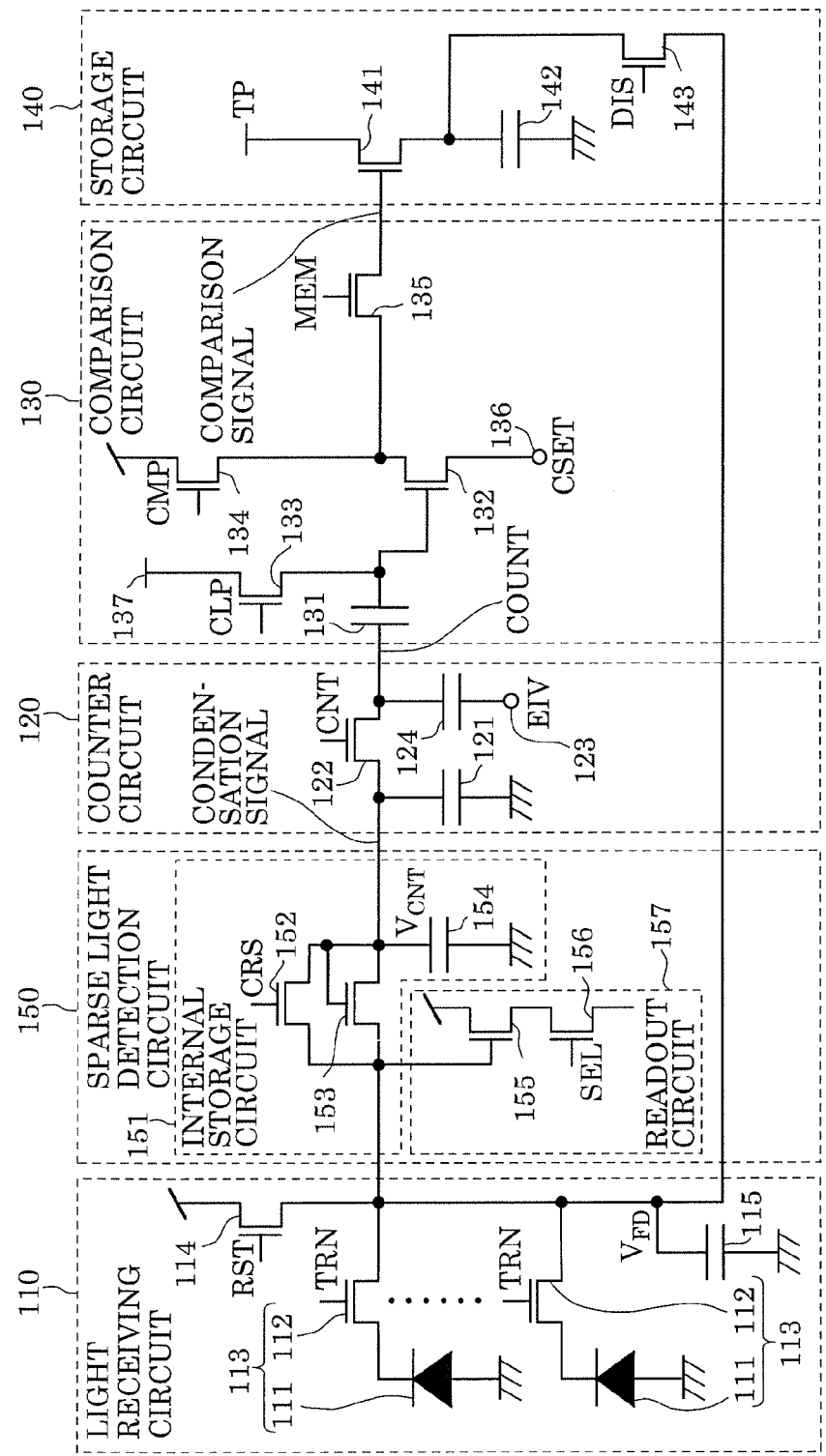
FIG. 8 is a circuit diagram showing an example of the configuration of each pixel according to Embodiment 2.

In Embodiment 2, solid-state imaging device 10 further includes sparse light detection circuit 150 in addition to the configuration in Embodiment 1, as shown in FIGS. 7 and 8. The term "sparse light" used herein is named based on the fact that "sparse" means the arrival of a photon, which is the minimum unit of light.

In the following sections, a specific description will be made of pixels and a method for driving the pixels according to Embodiment 2. In the following description, differences from Embodiment 1 will be primarily described, and common and duplicated portions will not be described in some cases. For example, the overall configurations of distance measuring apparatus 1 and solid-state imaging device 10 are the same as those in Embodiment 1 and will not be described below in detail.

—Overview of Sparse Light Detection Circuit—

An overview of the configuration and function of sparse light detection circuit 150 will first be described.

Sparse light detection circuit 150 accommodates one internal storage circuit 151, and the state of internal storage circuit 151 can be set at "H" (high level) or "L" (low level). In a case where the light reception signal from light receiving circuit 110 shows that light have been received, the state of internal storage circuit 151 is changed to "H". On the other hand, in a case where no light has been received, the state of internal storage circuit 151 is not changed. Therefore, when the light exposure is repeatedly performed multiple times, and light has been received at least once in a period in which light exposure is performed multiple times, the state of internal storage circuit 151 changes to "H". The state is output as a condensation signal to downstream counter circuit 120. After the state is output, sparse light reset signal CRS causes the state of internal storage circuit 151 to return to "L". The steps described above are called one set of steps, and repeating the one set of steps "b" times (b is arbitrary natural number) allows the same distance measurement as that in Embodiment 1 even in the case where the received light reflected off an object and the background light are very weak. In other words, counting the number "c" of arrivals of the background light and the number "f" of arrivals of the received light by using the condensation signal having a high probability of the change to the state "H" allows the same distance measurement as that in Embodiment 1 with no increase in the number of counting actions even in the case where the received light reflected off an object and the background light are very weak.

—Configuration of Pixels—

The configuration of each of the pixels will be specifically described below with reference to FIG. 8. It is noted that light receiving circuit 110, counter circuit 120, comparison circuit 130, and storage circuit 140, which form the four blocks, are the same components as those in Embodiment 1 and will not be described in detail in some cases.

Sparse light detection circuit 150 includes sparse light reset transistor 152 and sparse light storage transistor 153, which are connected in parallel to each other between the input and the output of sparse light detection circuit 150, sparse light storage capacitor 154, which is located between the output node of sparse light detection circuit 150 and the ground, amplification transistor 155, and row selection transistor 156. Out of the components described above, sparse light reset transistor 152, sparse light storage transistor 153, and sparse light storage capacitor 154 form internal storage circuit 151 described above.

Sparse light reset signal CRS output from pixel driving circuit 14 is supplied to the gate of sparse light reset transistor 152. The gate of sparse light storage transistor 153 is connected to the output node of sparse light detection circuit 150. That is, sparse light storage transistor 153 is a transistor serving as a diode connected between the input and output of sparse light detection circuit 150. Amplification transistor 155 and row selection transistor 156 are connected in series to each other between the power source and the input terminal of CDS circuit 15.

Sparse light reset transistor 152, sparse light storage transistor 153, amplification transistor 155, and row selection transistor 156 are each an N-type transistor. That is, also in the present embodiment, the transistors used in light receiving circuit 110, sparse light detection circuit 150, counter circuit 120, comparison circuit 130, and storage circuit 140, which form each of the pixels, are each formed of an N-type transistor. The configuration described above eliminates the need for formation of N-type well regions, whereby the area of each of the pixels can be reduced.

—Operation of Solid-State Imaging Device—

The operation of solid-state imaging device 10 according to the present embodiment will next be specifically described. It is assumed in the description that the intensity of the background light is sufficiently small with respect to the projection light projected from the light source. In this case, the number "c" of arrivals of the background light is substantially "0", and the background light sensing period can therefore be omitted.

The one frame period is divided into the background light sensing period, the distance measuring period, and the distance signal outputting period, as shown in FIG. 4, as in Embodiment 2. The operation in the background light sensing period and the distance signal outputting period is the same as that in Embodiment 1 and will not be described below in detail.

Figure 9:
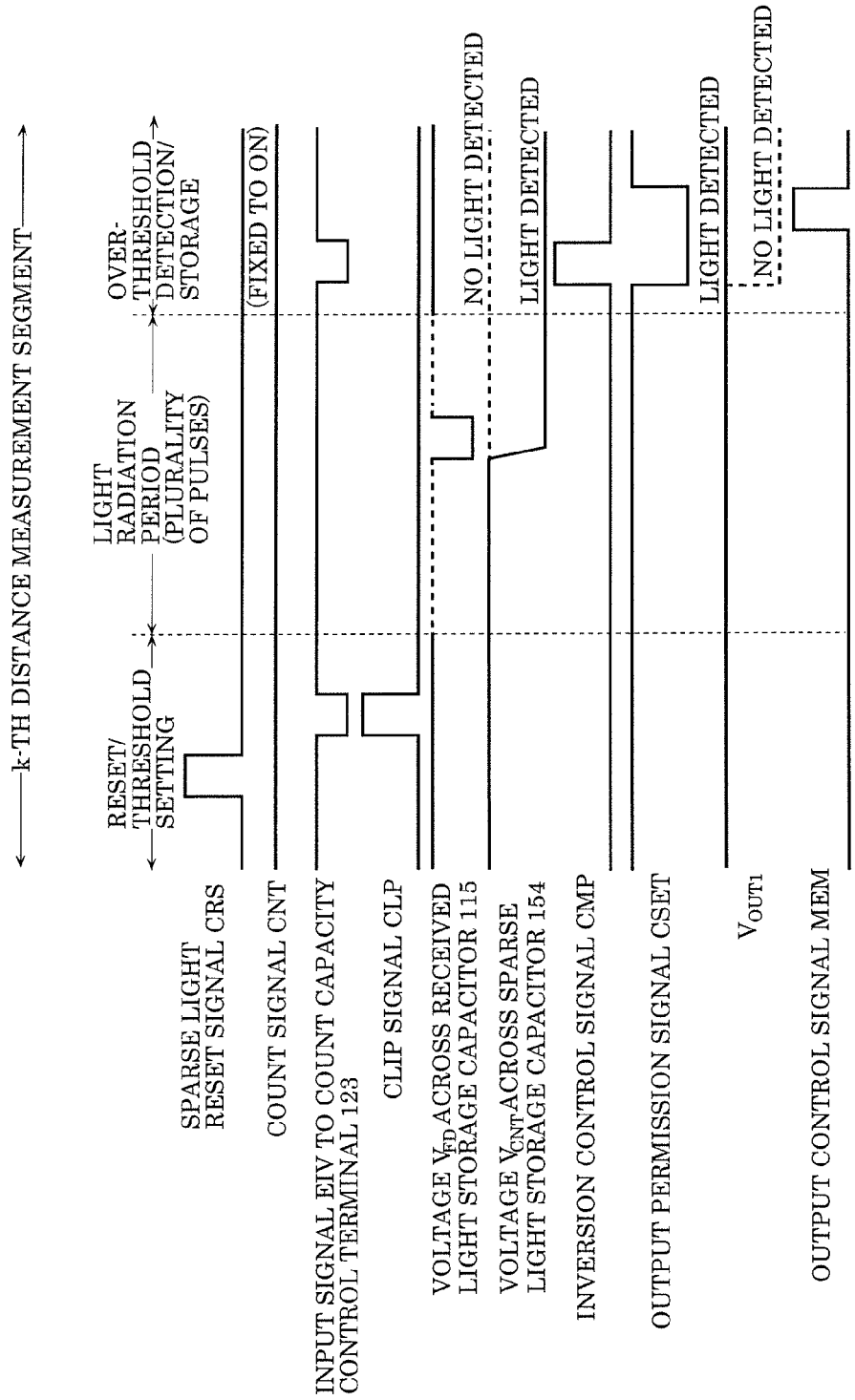
FIG. 9 describes the operation sequence in the distance measuring period.
Figure 10:
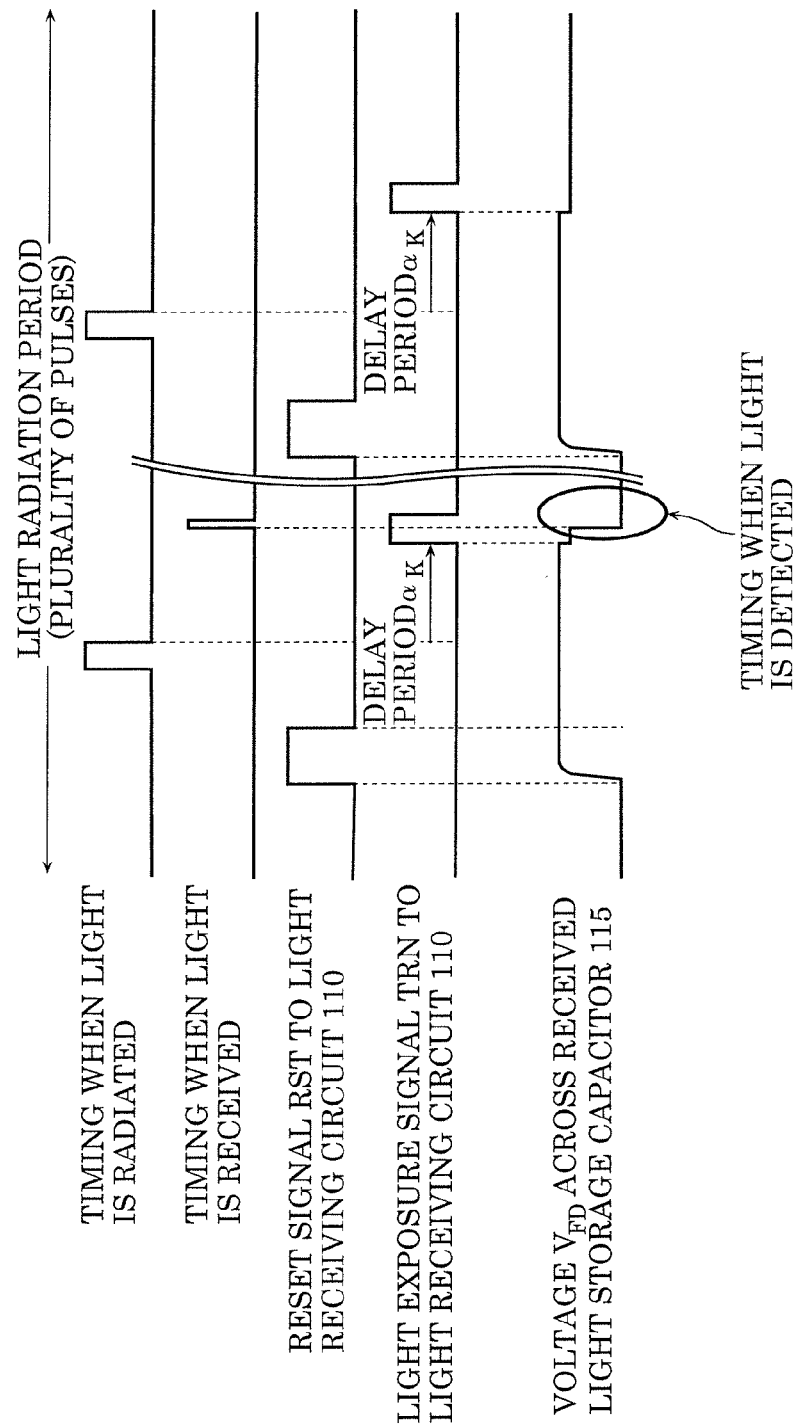
FIG. 10 describes the operation sequence in a light radiation period.

The operation in the distance measuring period according to the present embodiment will be specifically described below. FIG. 9 describes the operation sequence in the distance measuring period according to the present embodiment. FIG. 10 describes the sequence in accordance with which light receiving circuit 110 is driven and the operation sequence in a light radiation period according to the present embodiment.

The distance measuring period shown in FIG. 4 is first further divided into N periods, as shown in FIG. 9. Out of the N periods, the distance measuring period in the k-th position (1≤k≤N) (hereinafter also referred to as the k-th distance measuring period) is further divided into the following three periods: a reset/threshold setting period; the light radiation period; and an over-threshold detection/storage period. FIG. 9 collectively shows the sequences in accordance with which sparse light detection circuit 150, counter circuit 120, and comparison circuit 130 are driven.

(Reset/Threshold Setting Period)

The sequence in accordance with which light receiving circuit 110 is driven in the reset/threshold setting period, which is the first period, will be described with reference to FIG. 10. FIG. 10 further shows the timing when light is radiated.

First, reset signal RST turns on reset transistor 114, and the charge in received light storage capacitor 115 is reset. Light source 40 then projects emitted light pulses toward an object under measurement. The projected emitted light pulses are reflected off the target under measurement, and the reflected light returns to solid-state imaging device 10. If the period by which the reflected light is delayed roughly coincides with a delay period αk set in the k-th distance measuring period, the target under measurement is present in the distance segment measured in the k-th distance measuring period. It is assumed that the above situation is the case.

Light exposure signal TRN is turned ON at a timing delayed by the delay period αk from the timing when the emitted light pulses are projected. The reflected light received in the period for which light exposure signal TRN is ON undergoes photoelectric conversion in light receiving circuit 110, and the charge produced by the photoelectric conversion is transferred via transfer gate transistor 112, resulting in a decrease in voltage $V_{FD}$ across received light storage capacitor 115. The decreased voltage is output to downstream sparse light detection circuit 150. Reset signal RST then turns on reset transistor 114, which resets the charge in received light storage capacitor 115 again. The steps described above are repeated "b" times (b is arbitrary natural number). At this point, in a case where voltage $V_{FD}$ across received light storage capacitor 115 decreases at least once out of "b" times, sparse light storage capacitor 154 in sparse light detection circuit 150 stores the decreased voltage, as will be described below.

The operation of sparse light detection circuit 150 will next be described.

First, sparse light reset signal CRS is turned ON, so that sparse light reset transistor 152 is turned ON. Sparse light storage capacitor 154 in sparse light detection circuit 150 and reset transistor 114 in light receiving circuit 110 are therefore electrically connected to each other. At the same time, reset signal RST is turned ON, so that the charge in sparse light storage capacitor 154 is reset. Thereafter, reset signal RST is turned OFF, and sparse light reset signal CRS is then turned OFF.

Input signal EIV input to counter capacity control terminal 123 is then set at "L", and clamp signal CLP turns on clamp transistor 133. As a result, the voltage supplied to the drain of clamp transistor 133, that is, the clamp voltage supplied to clamp terminal 137 is applied to DC blocking capacitor 131. The clamp voltage has been set at voltage higher than threshold voltage of input transistor 132, as described above. Thereafter, input signal EIV is set at "H" to turn off clamp transistor 133.

(Light Radiation Period)

The light radiation period will next be described.

In the light radiation period, the control pulses that control sparse light detection circuit 150, counter circuit 120 and comparison circuit 130 are not turned ON or OFF. If voltage $V_{FD}$ across received light storage capacitor 115 decreases at any timing in the light radiation period, sparse light storage transistor 153 is turned ON because voltage $V_{CNT}$ across sparse light storage capacitor 154 has been set at high voltage. Voltage $V_{CNT}$ is therefore set at voltage that is the sum of voltage $V_{FD}$ and the threshold voltage of sparse light storage transistor 153. At the same time, sparse light storage transistor 153 is nearly turned OFF and will not be turned ON afterwards unless voltage lower than voltage $V_{FD}$ input as described above is input to sparse light storage transistor 153. The condensation signal described above is thus accumulated in sparse light storage capacitor 154.

(Over-Threshold Detection/Storage Period)

The over-threshold detection/storage period will next be described.

First, input signal EIV input to counter capacity control terminal 123 is set at "L", and inversion control signal CMP turns on inversion transistor 134 to set output permission signal CSET to permission signal input terminal 136 at "L". The behavior of sparse light detection circuit 150 at this point is formed of the following two behaviors: the behavior in a case where no light has been detected, that is, in a case where voltage $V_{CNT}$ across sparse light storage capacitor 154 remains "H" and the behavior in a case where light has been detected, that is, voltage $V_{CNT}$ changes to "L".

First, in the case where light has been detected, the voltage at the gate of input transistor 132 in comparison circuit 130 is lower than the threshold voltage. Input transistor 132 is therefore turned off. At this point, voltage $V_{OUT1}$ at the drain of threshold setting transistor 135 (side connected to input transistor 132) is set or maintained at the voltage of the power source, which is the voltage at the drain of inversion transistor 134. The voltage is stored by the parasitic capacity at the node. Thereafter, input signal EIV to counter capacity control terminal 123 is set at "H", and inversion control signal CMP causes inversion transistor 134 to return back to the off state.

Thereafter, output control signal MEM turns on threshold setting transistor 135, so that the gate of distance signal switching transistor 141 in storage circuit 140 is set at the voltage of the power source, that is, "H". As a result, the voltage at terminal TP is written onto distance storage capacitor 142 via distance signal switching transistor 141. The voltage at terminal TP has been set at the corresponding voltage in the k-th distance measuring period in a one-to-one relationship. The voltage corresponding to the distance to the target under measurement (object) is written onto distance storage capacitor 142. Output permission signal CSET to permission signal input terminal 136 is then caused to return to "L".

On the other hand, in the case where no light has been detected, the voltage at the gate of input transistor 132 in comparison circuit 130 is higher than the threshold voltage because the voltage at the gate of input transistor 132 has been set in advance at the voltage at the drain of clamp transistor 133. Input transistor 132 is therefore turned on. As a result, voltage $V_{OUT1}$ at the drain of threshold setting transistor 135 is set at voltage of signal CSET, that is, "L". Thereafter, input signal EIV to counter capacity control terminal 123 is set at "H", and inversion control signal CMP causes inversion transistor 134 to return back to the off state.

Thereafter, output control signal MEM turns on threshold setting transistor 135, and the gate of distance signal switching transistor 141 in storage circuit 140 is set at "L". The voltage across distance storage capacitor 142 therefore does not change, resulting in transition to the following distance measuring period.

After the measurement is performed in all the distance measuring periods as described above, the voltage corresponding to the distance to the target under measurement (object) corresponding to each of pixels 100 has thus been written onto distance storage capacitor 142. In the case where no target under measurement (object) is present within the distance measurement range, distance storage capacitor 142 has been set at the reset voltage.

Thereafter, turning on distance selection transistor 143 causes the voltage signal from distance storage capacitor 142 to be output to amplification transistor 155. The distance signal can thus be read out to CDS circuit 15 via row selection transistor 156. Thereafter, reset signal RST turns on reset transistor 114 to read the reset level to CDS circuit 15 and reset distance storage capacitor 142. The steps for one pixel 100 thus end.

As described above, solid-state imaging device 10 in Embodiment 1 further includes sparse light detection circuit 150 located between light receiving circuit 110 and counter circuit 120. Light receiving circuit 110 performs the light exposure multiple times in the light exposure period. In the state where incident light has arrived at least once in a period in which light exposure is performed multiple times, sparse light detection circuit 150 outputs an arrival signal indicating the arrival of incident light as the light reception signal to counter circuit 120. Counter circuit 120 counts the number of arrivals of the incident light based on the arrival signal received from sparse light detection circuit 150.

Therefore, also in the case where the reflected light has a small amount of energy in the signal light, the distance can be measured with satisfactory accuracy.

Sparse light detection circuit 150 may include internal storage circuit 151 that stores information indicating the state where the incident light has arrived at least once.

Therefore, also in the case where the received light is very weak, an increase in the number of counting actions performed by counter circuit 120 can be suppressed.

In this case, internal storage circuit 151 may include sparse light storage transistor 153 and light reset transistor 152 each having the first conductivity type. Sparse light storage transistor 153 is connected between the input and the output of internal storage circuit 151 and serves as a diode. Light reset transistor 152 is connected in parallel to sparse light storage transistor 153 and, in response to the reset signal, resets sparse light storage transistor 153 not to store the information.

In this case, solid-state imaging device 10 may further include distance selection transistor 143 having the first conductivity type and readout circuit 157. Distance selection transistor 143 is connected to a first node via which the light reception signal is output and a second node via which the distance signal is output, and is turned ON and OFF in accordance with the selection signal. Readout circuit 157 is connected to the first node and distance selection transistor 143, and selectively reads out the light reception signal and the distance signal. The first node is an output line of light receiving circuit 110 that is the output line to which a plurality of light receivers 113 are connected in FIG. 8. The second node is a connection line to which distance signal switching transistor 141 and distance storage capacitor 142 are connected in FIG. 8.

INDUSTRIAL APPLICABILITY

Since the solid-state imaging device according to the present disclosure has a wide measurable distance range and is capable of distance measurement even under a strong background light environment and can therefore be used in an automobile instrument, a distance measuring apparatus, and the like for collision prevention or automatic driving.

The invention claimed is:
1. A solid-state imaging device, comprising:
a plurality of pixels that are arranged two-dimensionally, wherein the plurality of pixels each include
a light receiving circuit that includes a light receiving element and outputs a light reception signal, the light reception signal changing in accordance with whether or not incident light arrives at the light receiving element in a light exposure period;
a counter circuit that counts, based on the light reception signal, a number of the arrivals indicating how many times incident light arrives at the light receiving element, and outputs a result of the counting as a count;
a comparison circuit that receives a threshold setting signal, sets a threshold corresponding to the count based on the threshold setting signal, and outputs a comparison signal that is ON when the count is greater than the threshold; and
a storage circuit that receives a time signal corresponding to a distance measuring period taken by the comparison circuit and the counter circuit to perform distance measuring, and stores the time signal as a distance signal when the comparison signal is ON, and
wherein the light receiving circuit, the counter circuit, the comparison circuit, and the storage circuit each include a transistor having a first conductivity type.
2. The solid-state imaging device according to claim 1, wherein the comparison circuit includes an input transistor having the first conductivity type, the input transistor including a gate that receives the count, the input transistor outputting the comparison signal that is ON when the count is greater than the threshold in a comparison operation period, and
the input transistor is inactive irrespective of a magnitude of the count in a period excluding the comparison operation period.
3. The solid-state imaging device according to claim 1, further comprises:
a sparse light detection circuit located between the light receiving circuit and the counter circuit,
wherein the light receiving circuit performs light exposure multiple times in the light exposure period, when incident light arrives at the light receiving element at least once in a period in which the light exposure is performed the multiple times, the sparse light detection circuit outputs, to the counter circuit, an arrival signal indicating the arrival of the incident light as the light reception signal, and the counter circuit counts the number of the arrivals based on the arrival signal received from the sparse light detection circuit.

4. The solid-state imaging device according to claim 3, wherein the sparse light detection circuit includes an internal storage circuit, and in a state where incident light arrives at the light receiving element at least once, the internal storage circuit stores information indicating the state.

5. The solid-state imaging device according to claim 4, wherein the internal storage circuit includes a storage transistor having the first conductivity type and a reset transistor having the first conductivity type, the storage transistor being connected between an input of the internal storage circuit and an output of the internal storage circuit and serving as a diode, the reset transistor being connected in parallel to the storage transistor and resetting the storage transistor not to store the information in response to a reset signal.

6. The solid-state imaging device according to claim 1, further comprising:

a distance selection transistor having the first conductivity type, the distance selection transistor being connected to a first node via which the light reception signal is output and a second node via which the distance signal is output, the distance selection transistor being turned ON and OFF in accordance with a selection signal; and a readout circuit connected to the first node and the distance selection transistor, the readout circuit selectively reading out the light reception signal and the distance signal.

\* \* \* \* \*